United States Patent [19]

Buck et al.

[11] 4,310,809
[45] Jan. 12, 1982

[54] LOW NOISE MICROSTRIP VOLTAGE CONTROLLED OSCILLATOR

[75] Inventors: Daniel C. Buck, Hanover; Ricky D. Hess, Annapolis; Edward C. Niehenke, Baltimore, all of Md.

[73] Assignee: Westinghouse Electric Corp., Pittsburgh, Pa.

[21] Appl. No.: 33,935

[22] Filed: Apr. 27, 1979

[51] Int. Cl.³ .............................................. H03B 5/18
[52] U.S. Cl. ............................. 331/117 D; 331/177 V
[58] Field of Search ............. 331/96, 117 D, 107 SL, 331/177 V, 101; 332/30 V

[56] References Cited

U.S. PATENT DOCUMENTS

| | | | |
|---|---|---|---|
| 3,377,568 | 4/1968 | Kruse, Jr. et al. | 331/117 D |
| 3,798,553 | 3/1974 | Sakamoto | 331/117 D X |
| 4,156,211 | 5/1979 | Buswell et al. | 331/117 D |
| 4,189,690 | 2/1980 | Bock et al. | 331/117 D X |

Primary Examiner—Siegfried H. Grimm
Attorney, Agent, or Firm—J. B. Hinson

[57] ABSTRACT

The invention comprises a microwave oscillator using a stripline circuit. The active device utilized in the oscillator is a bipolar transistor. A microstrip circuit is coupled to the emitter of the transistor while the collector is coupled to ground. This generates a negative impedance characteristic at the base of the transistor at the operating frequency. The operating frequency is determined by a varactor which is series tuned with an inductor. The impedance of the series tuned circuit is transformed to match the input impedance of the transistor by a microstrip circuit. Microstrip isolation circuits are utilized to couple appropriate bias signals to the emitter and the base to establish the proper operating point for the bipolar transistor. The output signal is taken from the base circuit of the transistor through the series combination of two microstrip circuits and a capacitor. A second varactor is loosely coupled to the base circuit of the transistor to provide for fine tuning. The frequency control characteristic of the oscillator can be made linear by utilizing a hyper abrupt varactor.

8 Claims, 5 Drawing Figures

LOW NOISE MICROSTRIP VOLTAGE CONTROLLED OSCILLATOR

STATEMENT OR GOVERNMENT INTEREST

The U.S. Government has right in this invention pursuant to Contract No. F33615-74-C-1040 awarded by the Department of Defense.

BACKGROUND OF THE INVENTION

1. Field of the Invention

The invention relates to oscillators and more specifically to voltage controlled microwave oscillators.

2. Description of the Prior Art

Typically, prior voltage controlled oscillators operating at X-band and higher have been implemented using Gunn diodes and resonant cavities. These circuits had the disadvantage that they were relatively complex to build due to the inherent complexity of constructing resonant cavities at X-band (7–12 GHz) frequencies. Additionally, these circuits tended to have moderate post tuning drift characteristics. The high junction temperatures of the Gunn diodes reduced the reliability of the circuits. A need exists for high frequency oscillators (7–12 GHz which exhibit the desirous features of low post tuning drift, low noise rapid frequency changing capability and extremely linear frequency versus voltage characteristics. In the prior art, attempts have been made to meet these needs by using a low frequency oscillator followed by a frequency multi-plier. This resulted in circuits which were expensive, difficult to tune and an output signal high in harmonic content.

SUMMARY OF THE INVENTION

The preferred embodiment of the invention is an oscillator circuit which includes an amplifying circuit having a negative input impedance within the operating frequency range of the oscillator. A tuning circuit including a series coupled inductor and varactor is coupled to the input of the amplifying device through a network such that the locus of the input admittance of said amplifying device at the oscillating frequency for increasing signal amplitude is substantially perpendicular to and lags the locus of the combined admittance for increasing frequency of the remainder of the circuitry at the oscillating frequency and signal amplitude within the operating band of the oscillator.

DESCRIPTION OF THE PREFERRED EMBODIMENT

Figure 1:
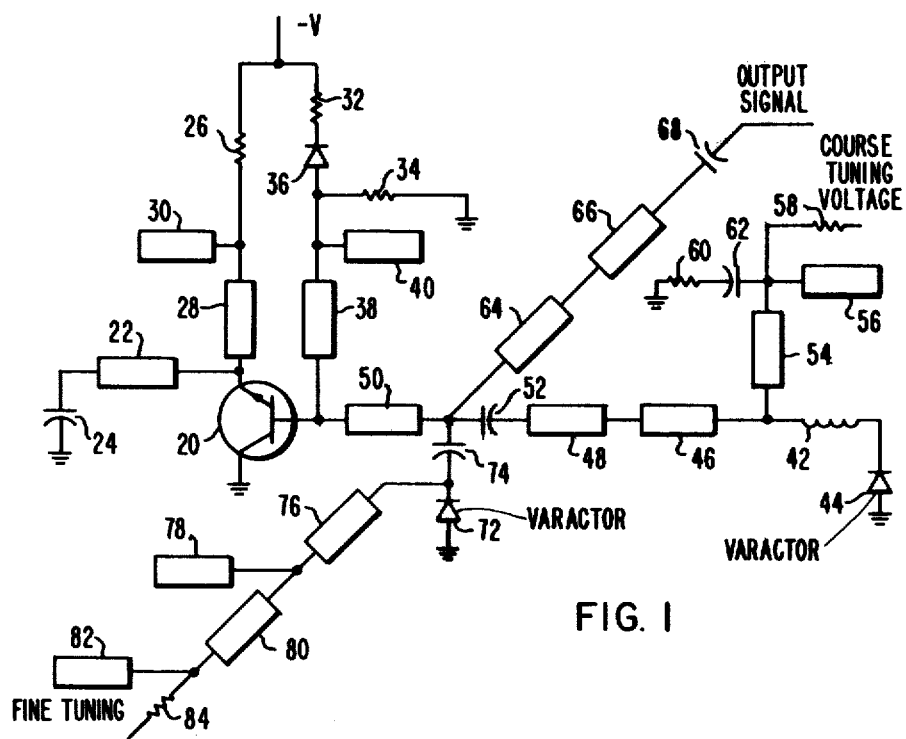
FIG. 1 is a schematic diagram of the preferred embodiment of the invention.

FIG. 1 is a schematic diagram of the preferred embodiment of the invention. In the preferred embodiment the oscillator is constructed using microstrip circuits. As an active element, the oscillator utilizes a bipolar transistor 20 connected in the grounded collector configuration. The emitter is coupled to ground through the series combination of a microstrip element 22 and a capacitor 24. The parameters of the microstrip circuit 22 and the capacitor 24 are selected to give an approximate maximum reflection coefficient at the base of the transistor 20 at the center of the desired operating frequency range. Other circuit configurations could be used so long as the desired negative input impedance is maintained.

A first end of a high impedance microstrip circuit 28 of approximately one-quarter wavelength at the operating frequency is coupled to the emitter of the transistor 20. The second end of microstrip circuit 28 is coupled to the first end of a low impedance microstrip circuit 30. The second end of microstrip circuit 30 is open. In this configuration, microstrip circuits 28 and 30 establish a low impedance node at the junction of these circuits and a high impedance node at the emitter of the transistor 20. DC emitter bias current is provided by a resistor 26 connected between the common node of stripline circuits 28 and 30 and a negative voltage supply. DC operating bias is supplied to the base of the transistor 20 by a second bias network comprising two resistors 32 and 34, and a diode 36. Resistors 32 and 34 establish a current through the diode 36 which is large compared to the DC base current of the transistor 20 to produce a substantially constant voltage at the junction of resistor 34 and diode 36. A filter network consisting of microstrip circuits 38 and 40 couples the junction of the resistor 34 and diode 36 to the base of the transistor 20 to establish the DC base current of the transistor 20. Microstrip circuit 38 is in the order of one-quarter wavelength at the operating frequency and is coupled from the junction of the diode 36 and resistor 34 directly to the base terminal of the transistor 20. Filtering is provided by selecting the microstrip circuit 40 such that it is in the order of one-quarter wavelength at the operating frequency of the oscillator. This in conjunction with the high characteristic impedance of microstrip circuit 38 decouples for RF the base of transistor 20 from the bias circuit.

The common junction of the bias resistors 26 and 32 is coupled to a negative bias voltage supply. The collector of transistor 20 is coupled to ground as previously described. Resistors 26, 32 and 34 are selected to have a value such that the collector to emitter voltage of the transistor 20 is approximately 10 volts with a collector current in the range of 20 to 40 ma depending on the transistor type used. As is common with all transistors with an increase in temperature, the base to emitter voltage of transistor 20 decreases. Similarly, the voltage drop across the diode 36 also decreases with an increase in temperature. This tends to maintain the collector current of transistor 20 substantially constant with changes in temperature. A constant collector current for transistor 20 has been found to be advantageous in that it improves the overall stability of the oscillator with changes in temperature.

Primary tuning is provided by a series LC network consisting of an inductor 42 and a varactor diode 44. The parameter of the inductor 42 and the varactor 44 are selected so that this series combination is approximately series resonant at the center operating frequency. A series circuit consisting of three microstrip circuits 46, 48 and 50 and a DC blocking capacitor 52 couples this series resonant circuit to the base terminal of the transistor 20. Microstrip circuit 46 is selected to be approximately one-quarter wavelength at the operating frequency. Microstrip circuit 48 is selected to be approximately an even multiple of quarter wavelengths at the operating frequency. This combination transforms the relatively low impedance of the series tuned circuit consisting of the inductor 42 and the varactor 44 into a high impedance at the junction of microstrip circuit 48 and a DC blocking capacitor 52. Similarly, the stripline 50 transforms the impedance of the base terminal of the transistor 20 to a parallel resonant circuit (high magnitude of negative resistance) at the junction of stripline 50 and capacitor 52. This combination causes the circuit to oscillate at the desired frequency. Placing DC blocking capacitor 52 at a high impedance point of the circuit also reduces the capacitor losses because it reduces the RF current through this capacitor.

Coarse tuning of the oscillator is provided by controlling the DC bias on the varactor 44. This is accomplished by coupling a coarse tuning voltage to the junction of inductance 42 and the microstrip circuit 46. RF isolation of the coarse tuning voltage is provided by a series quarter wavelength microstrip circuit 54 and a second open end quarter wave microstrip circuit 56. The coarse tuning voltage is coupled to the junction of the microstrip circuits 54 and 56 through an isolation resistor 58. The resistor 58 prevents parametric oscillations between the varactor and bias circuits. Resistor 58 may not be required on some oscillators. Additional filtering to prevent the circuit from oscillating at spurious frequencies is provided by a series RC network consisting of a resistor 60 and a capacitor 62.

Functionally, coarse tuning is provided by changing the capacitance of the varactor 44 by changing the tuning voltage. The change in the varactor capacitance changes the series resonant frequency of the series circuit consisting of the varactor 44 and inductance 42.

A high series impedance output circuit consisting of microstrip circuits 64 and 66 and capacitor 68 is coupled between the output terminal and the junction of microstrip circuit 50 and capacitor 52 to provide a useful output signal. As previously discussed the junction of microstrip circuit 50 and capacitor 52 is a high impedance node at the operating frequency. The high series impedance of the output circuit prevents excessive loading of this node.

To assure that the circuit is lightly loaded microstrip circuit 64 is a quarter wave section of high characteristic impedance transmission line 64 and microstrip circuit 66 is a quarter wave section of low impedance transmission line. A blocking capacitor 68 provides DC isolation. This coupling arrangement assures that approximately 80 percent of the power generated by the circuit is coupled into the primary tuning circuits while 20 percent is coupled to the load. The microstrip circuit 50 transforms the input admittance of the transistor 20 to match the total admittance at the junction of microstrip circuit 64 and capacitor 52 to a near optimal value for constant power over the entire coarse tuning range. This condition leads to approximately constant power dissipation in the transistor 20 and the varactor 44 over the coarse tuning range. Constant power dissipation in these elements in combination with low thermal resistance between these elements and the metal base member of the microstrip circuit results in low post tuning drift.

The near optimum admittance matching described above also assures low noise, single frequency operation because the locus of the admittance of the transistor 20 at the oscillating frequency for increased signal amplitude as transformed by microstrip circuit 50 at a particular operating frequency is approximately perpendicular to and lags the locus of the admittance of the load and varactor circuits for increasing frequency at the final operating point. This desirable condition also prevails for any frequency in the operating band.

The oscillator incorporates a fine tuning network. This network is lightly coupled and as a result the effect of this circuit on overall circuit performance was not considered in the above discussion. This circuit can be used as a fine tuning in the oscillator in response to a DC fine tuning voltage or it may be used in a conventional fashion to phase lock the oscillator to a reference signal. Functionally the fine tuning circuit utilizes a varactor diode 72 which is lightly coupled to the high impedance node of the stripline circuit 50 and coupling capacitor 52 by a small capacitor 74.

This in effect generates a parallel circuit which comprises the varactor 72 and the microstrip circuit 76. A quarter wave open-ended microstrip circuit 78 effectively shorts the second end of the microstrip circuit 76 to ground to complete the resonant circuit. Additional isolation of the fine tuning circuit from the fine tuning voltage is provided by a second filter consisting of microstrip circuits 80 and 82. Microstrip circuit 80 is approximately one-quarter wavelength at the operating frequency and microstrip circuit 82 is approximately one-quarter wavelength. Further isolation of the tuning voltage is provided by a series-coupling resistor 84 which prevents parametric oscillations which could arise from the varactor 72 being pumped by the signal frequency. In some circuits resistor 84 may not be needed.

Figure 2:
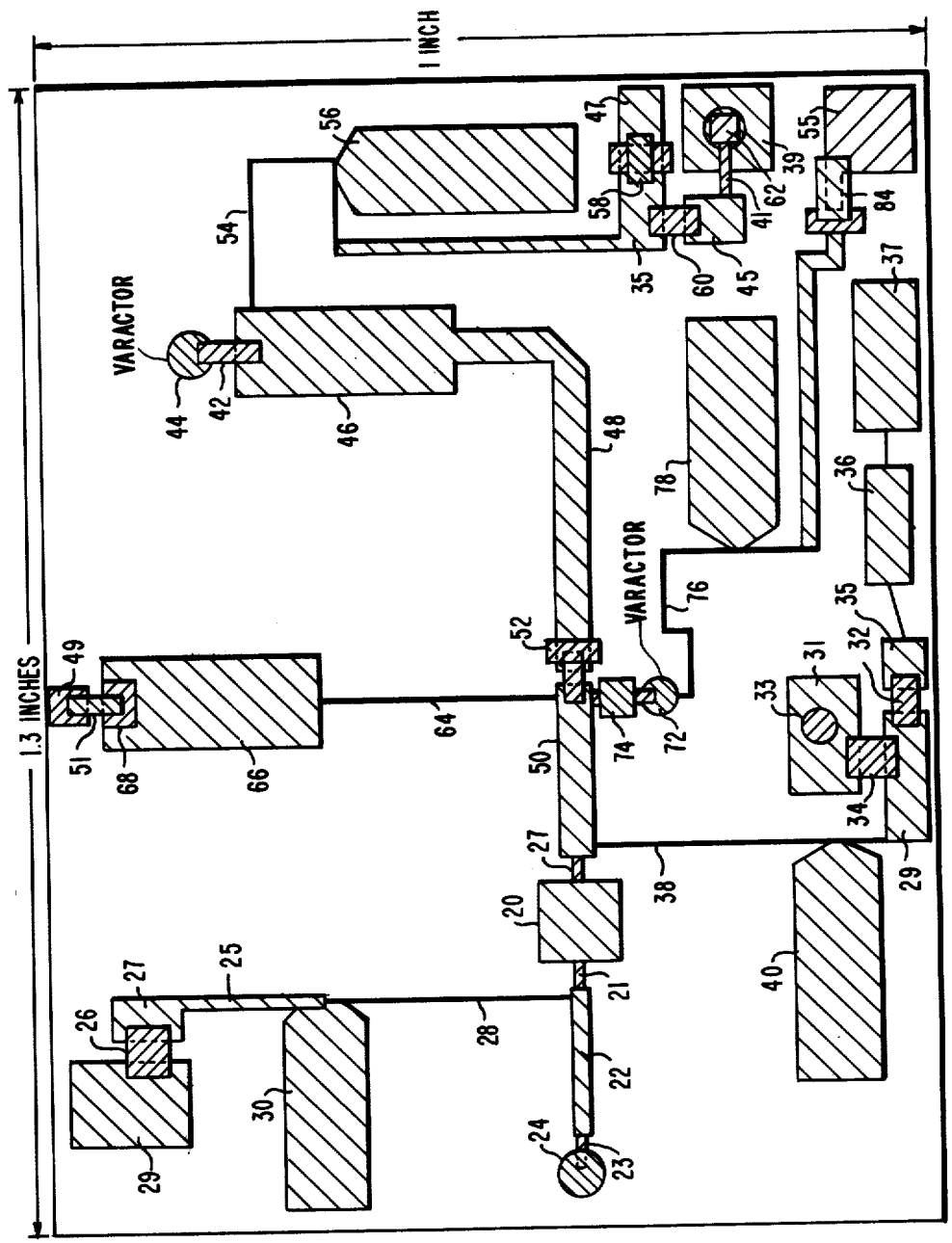
FIG. 2 is a top view of a microstrip implementation of the circuit illustrated in FIG. 1.

FIG. 2 is a top view of the actual microstrip implementation of the circuit illustrated schematically in FIG. 1 except that the filter section comprising microstrip sections 80 and 82 are not implemented. The same reference numbers used in FIG. 1 will be utilized to identify similar circuits in FIG. 2. FIG. 2 is drawn approximately to scale for a circuit operating in the range of 6 to 11 GHz.

The microstrip circuit illustrated in FIG. 2 is constructed on an aluminum base member having a length of approximately 1.3 inches and a width of 1 inch. The thickness of the aluminum is approximately 3/16 inch. The actual microstrip circuits are formed by laminating a DUROID layer typically 0.015" thick to the top surface of the aluminum base member and using a pattern of copper conductors overlying the DUROID layer to form the elements of the microstrip circuits. (DUROID is a trade mark for a low loss insulating material marketed by the Rogers Corp.) This type of structure has the advantage that it may be easily machined using conventional techniques to form cavities for mounting components as well as providing mounting holes for securing the oscillator in equipment in which it is used. The circuit of FIG. 1 may also be implemented using stripline circuits or discrete components.

Transistor 20 is what is known in the art as a packaged transistor. More specifically, transistor 20 is a high gain bipolar microwave transistor type Nos. 567 or 645 made by Nippon Electric Corp. This transistor is available in a package having a rectangular surface which is the collector electrode. The base and emitter electrodes extend from opposite sides of the package at approximately the middle. This transistor is mounted in the microstrip circuit by milling a cavity slightly larger than the transistor in DUROID layer and in the aluminum base and affixing the collector electrode to the bottom of the cavity either by soldering or with an electrically conductive epoxy compound. The depth of the cavity in the aluminum base is selected such that base and emitter leads of the transistor extend outwardly at the surface level of the microstrip circuit.

Microstrip circuit 22 is a short section of copper conductor affixed to the upper surface of the DUROID layer. The other microstrip circuits are similarly formed. The base electrode 21 of transistor 20 is affixed to the first end of the microstrip circuit 22 by soldering. A capacitor 24 is connected between the second end of microstrip circuit 22 and the aluminum base member which serves as ground. Capacitor 24 is a chip-type capacitor and is connected in the circuit by first drilling a hole in the aluminum base member. A plated stainless steel roll pin is then pressed into the hole such that the roll pin makes good electrical contact with the aluminum base member. The bottom electrode of capacitor 24 is then soldered to the top end of the roll pin. A very short copper strap 23 is then soldered from the top electrode of capacitor 24 to the end of microstrip circuit 22.

As previously discussed a DC bias current is provided to the emitter terminal 21 of transistor 20 by a bias network consisting of a quarter wave microstrip 28, quarter wave microstrip section 30 and a resistor 26. More specifically, microstrip circuit 28 is a narrow strip of copper on the top surface of the DUROID layer and extends from one end of microstrip circuit 22 to a second microstrip circuit 30. Microstrip circuit 30 is a quarter wave section of relatively low impedance line which is connected in open end configuration. The common junction of microstrip circuits 28 and 30 is connected by a small strip 25 to a mounting pad 27. The minus voltage supply is coupled to a second mounting pad 29. Resistor 26 which is a small chip resistor is connected in the circuit by soldering it between mounting pads 27 and 29.

Bias current to the base of transistor 20 is provided through a quarter wave stripline circuit 38. Strip line circuit 38 joins one end of a stripline 50 with this junction coupled to the base terminal 27 of transistor 20.

The second end of the high impedance stripline 38 is coupled to one end of a low characteristic impedance stripline circuit 40. Since stripline circuit 40 is a quarter wavelength, the junction of striplines 38 and 40 is a relatively low impedance node due to the open end quarter wavelength microstrip circuit 40. This circuit also appears to be a high impedance at the base terminal 27 of transistor 20. A short section of conductive strip couples the common junction of stripline circuits 38 and 40 to a mounting pad 29. Another mounting pad 31 is connected to the aluminum base member by soldering this pad to a roll pin 33. A chip resistor 34 is mounted by soldering between mounting pads 29 and 31.

A second resistor is similarly soldered between the mounting pad 29 and mounting pads 35. The base biasing circuit is completed by soldering diode 36 between mounting pads 35 and 37. Mounting pad 37 is then coupled to the minus voltage source to provide bias current to the base of the transistor 20.

As discussed above the primary tuning elements of the oscillator is a varactor diode 44 and a tuning inductance 42. In actual practice the varactor diode is a high Q silicon tuning diode (Alpha Industries Type DVH 6730-04 in 247-001 package). Varactor 44 is mounted to the aluminum base by drilling a hole having a diameter slightly larger than the diameter of the varactor 44 through the DUROID layer and into the aluminum base member. The bottom electrode of the varactor 44 is affixed to the bottom surface of the hole by soldering or by electrically conductive epoxy. Tuning inductance 42 is a small copper strip which is soldered between the top electrode of the varactor 44 and one end of stripline circuit 46. The value of this inductor is adjusted to approximately series resonate the diode and its value is experimentally adjusted by making it either wider or narrower to fine tune the operating frequency band to the desired value.

Stripline circuit 46 is a quarter wave section of low characteristic impedance transmission line. The low impedance of the series circuit consisting of inductor 42 and the varactor 44 is transformed to a high impedance at the junction of stripline circuits 46 and 48. Stripline circuit 48 is a multiple of half wavelength microstrip transmission circuit which is connected between the second end of microstrip circuit 46 and a DC blocking capacitor 52 for increased circuit Q and bandwidth reduction. This line may be made up of two individual quarter wavelength lines of different characteristic impedance (one higher and one lower than 50 $\Omega$) for added flexibility to achieve various conditions for additional range of desired impedance matching requirements and bandwidth. Capacitor 52 is a chip-type capacitor which is soldered directly to the end of microstrip circuit 48. A microstrip circuit 50, approximately one-quarter wavelength long, transforms the low input impedance of transistor 20 to approximately a parallel resonant circuit. A small copper strip soldered between the end of microstrip circuit 50 and the second electrode of coupling capacitor 52 couples the coarse tuning circuit to the base of transistor 20.

Stripline circuits 46, 48 and 50 provides a convenient means of translating the low impedance of the series tuned coarse tuning circuit to match the input impedance of the transistor 20. This achieves the desired admittance matching function previously described. Additionally, it should be noted that the coupling capacitor 52 provides the necessary DC isolation between the base biasing circuits and the tuning voltages. This capacitor is deliberately placed at a high impedance node of the striplines to minimize losses. The low losses result directly from this being a low current portion of the circuit.

RF isolation is provided between the coarse tuning circuits and the coarse tuning voltage by a filter consisting of microstrip circuits 54 and 56. Microstrip circuit 54 is a high characteristic impedance quarter wave section connected between the end of microstrip circuit 46 and a first end of microstrip circuit 56. The second end of microstrip circuit 56 is open. Microstrip circuit 56 is a low characteristic impedance quarter wave section which effectively grounds the common junction of microstrip circuits 54 and 56 for RF signals. The common junction of microstrip circuits 54 and 56 is coupled by a short conductor to a mounting pad 35. An RC filter network consisting of resistor 60 and capacitor 62 is coupled between pad 35 and ground. The ground connection is provided by a pad 39 which is coupled to the aluminum mounting base by soldering this pad to the end of a roll pin. The bottom electrode of capacitor 62 is soldered directly to the top of the pad 35. The second or top electrode of capacitor 62 is coupled by a short copper strip 41 to a mounting pad 45 which serves as a common connection for resistor 60 and capacitor 62. The coarse voltage tuning circuit is completed by a resistor 58 which is coupled between mounting pad 35 and the coarse voltage tuning terminal 47.

The common node of microstrip circuits 48 and 50 is a high impedance node of the circuit, as previously described. The output signal is extracted from this node through a coupling network consisting of the series combination of a quarter wavelength high characteristic impedance stripline circuit 64, a quarter wave section of low impedance stripline circuit 66 and a capacitor 68. Capacitor 68 is a chip-type capacitor with its first electrode soldered directly to microstrip circuit 66. The second terminal of this capacitor 68 is coupled to an output pad 49 by a short copper strip 51.

Fine tuning is provided by a second varactor diode 72. The first terminal of this varactor diode is connected directly to the aluminum mounting base by drilling a hole having a diameter slightly larger than the diameter of the varactor 72 in the aluminum base member. The bottom electrode of the varactor is affixed to the bottom surface of the hole by soldering or with electrically conductive epoxy. If the varactor or other components are to be affixed to the aluminum base member by soldering, the aluminum base member must be plated first. Suitable plating processes are well known to those skilled in the art. The top electrode of the fine tuning varactor 72 is coupled to the common junction of stripline circuit 50 and capacitor 52 by a coupling capacitor 74 (typically 0.04 pf). Capacitor 74 is a small custom-fabricated capacitor comprising a layer of Duroid laminated on each side with copper. The size of the capacitor is experimentally determined to give very light coupling of the fine tuning varactor 72 to the circuit to achieve the desired fine tuning range. The modulation sensitivity (i.e. frequency change as a function of the change in the fine tuning voltage) is substantially independent of the coarse circuit tuning.

The top terminal of the fine tuning varactor 72 is also coupled to one end of a high impedance quarter wave stripline 76. The second end of stripline circuit 76 is held at approximately ground potential for RF signals by a low impedance open-ended stripline circuit 78. The common junction of stripline circuits 76 and 78 is coupled through a resistor 84 to the fine tuning input pad 55.

Figure 3:
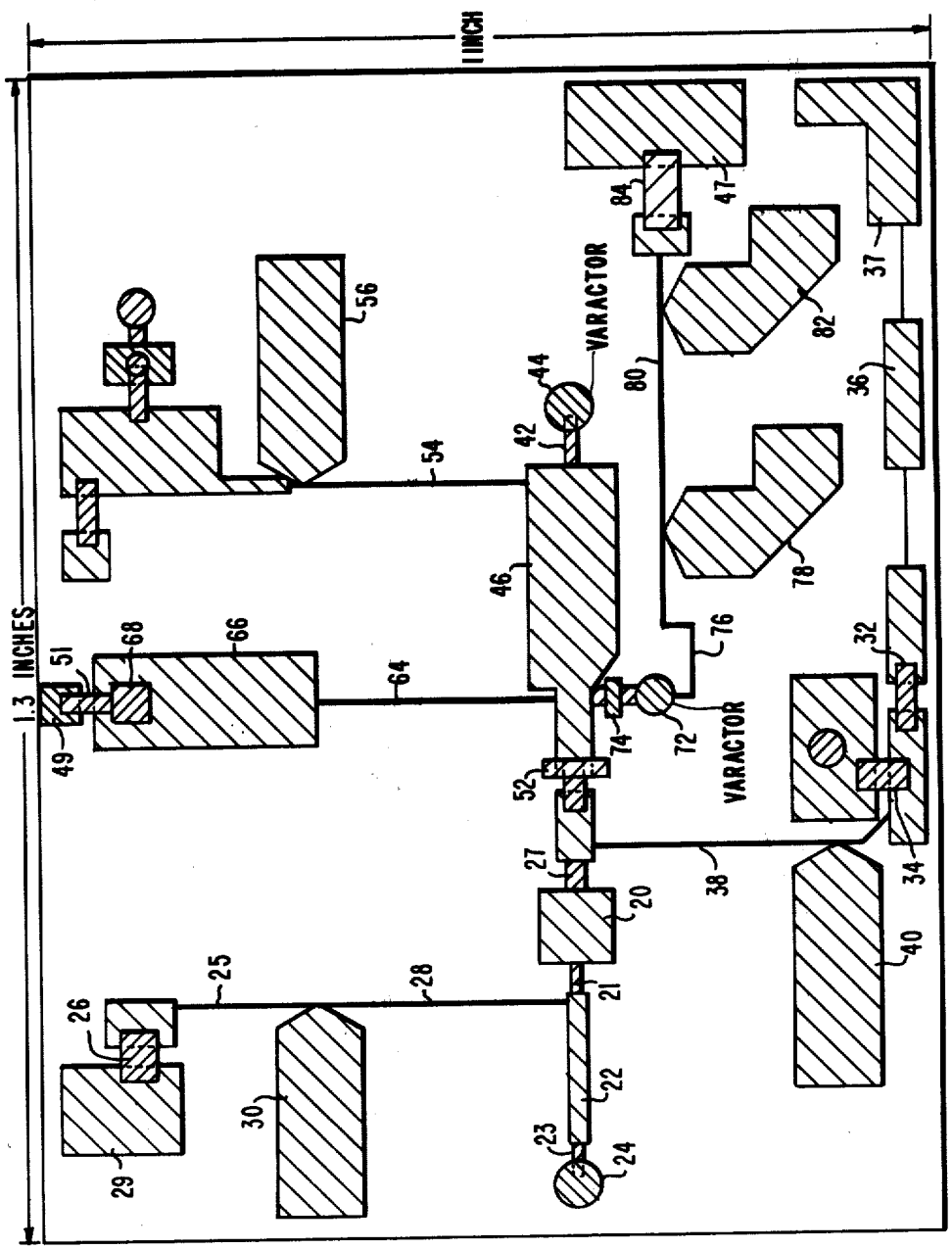
FIG. 3 is a top view of a microstrip circuit comprising a second embodiment of the invention.

FIG. 3 is a second embodiment of the invention, not including fine tuning. The same reference numbers used in FIG. 2 are used to identify similar functional parts in this Figure. FIG. 3 is different from FIG. 2 in that the half wave stripline circuit 48 has been eliminated. This has the effect of increasing the tuning range of the circuit because it increases the bandwidth over which the tuning circuit comprising tuning inductance 45 and the tuning varactor 44 can be matched to the input impedance of the transistor 20.

Figure 4:
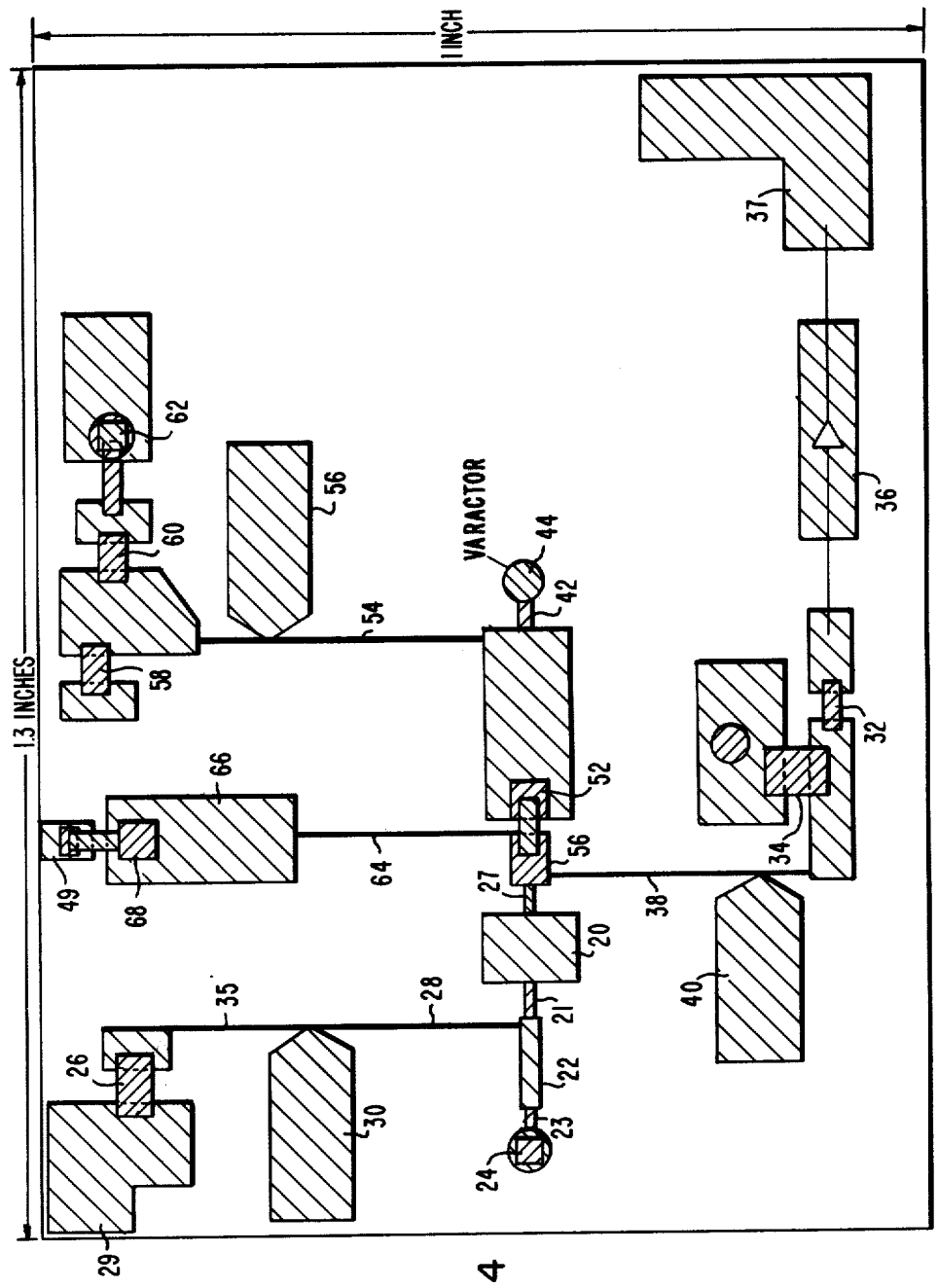
FIG. 4 is a top view of a microstrip circuit comprising another embodiment of the invention.

FIG. 4 is a modification of FIG. 1. Basically, this modification consists of the complete removal of the fine tuning circuit. The tuning varactor diode has also been changed to hyper-abrupt diode to give the circuit a linear tuning characteristic.

Figure 5:
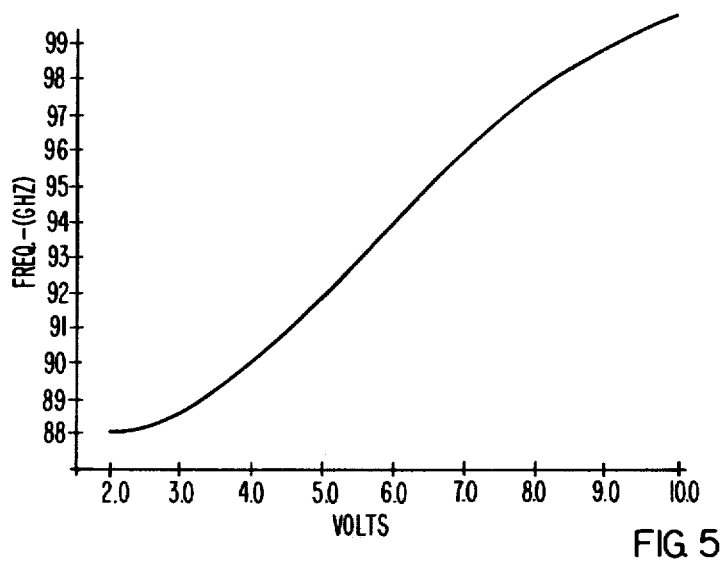
FIG. 5 is a tuning characteristic of the circuit illustrated in FIG. 4.

FIG. 5 is a curve showing the tuning characteristics of the oscillator illustrated in FIG. 4. This curve clearly illustrates that the frequency is a linear function over a substantial range of the coarse input tuning voltage.

Several circuits using the basic principles of the invention have been constructed and tested. Typically, for a step increase and decrease in frequency of 650 MHz the post tuning drift measured during a 2 to 500 microsecond interval was respectively 0.25 and 0.75 MHz. Fine tuning sensitivity in MHz/volt was 1.90 at 7.85 GHz, 2.0 at 8.17 GHz and 2.0 at 8.5 GHz. Power output was 10 mw±0.15 dB. The stripline circuits also provide low capacitance at the tuning voltage posts providing a fast response to changes in the tuning voltage. Other active devices such as field effect transistors could be used on the amplifying device. The FM noise for the various oscillators ranged between −125 dB/Hz to −132 dB/Hz at 1 MHz from the carrier.

We claim:

1. An oscillator circuit, comprising in combination:
   (a) a transistor having base, emitter and collector electrodes;
   (b) means for electrically coupling said collector electrode to the ground terminal of said oscillator circuit;
   (c) a first circuit means having a high impedance at the operating frequency of said oscillator coupling said emitter to a source providing bias current to said emitter;
   (d) a second circuit coupled between said emitter electrode and the ground terminal of said oscillator, the impedance of said second circuit means selected to reflect a negative impedance at the operating frequency of said oscillator at said base electrode;
   (e) first impedance transforming means having first and second terminals coupled to transform the negative impedance at said base electrode to a higher impedance at said second terminal;
   (f) series resonant circuit means, having a resonant frequency which is determined by a tuning voltage, coupled between the ground terminal of said oscillator and said second terminal of said first impedance transforming means; and
   (g) first and second transmission line means coupled between said second terminal of said first impedance transforming means and an output terminal of said oscillator, the characteristic impedance of said first and second transmission line means being respectively high and low at the operating frequency of said oscillator.

2. An oscillator circuit in accordance with claim 1 wherein said first circuit means comprises a one quarter wavelength section of strip line transmission line.

3. An oscillator circuit in accordance with claim 2 wherein said first impedance transforming means comprises a one quarter wavelength section of strip line transmission line.

4. An oscillator in accordance with claim 3 further including a voltage tunable fine tuning circuit coupled between said second terminal of said first impedance transforming means and the ground terminal of said oscillator.

5. An oscillator in accordance with claim 4 wherein said fine tuning circuit comprises a capacitor and a varactor diode coupled in series.

6. An oscillator in accordance with claim 5 including second impedance transforming means comprising a section of stripline transmission line having an odd multiple of one quarter wavelengths, coupling said series resonant circuit means to said second terminal of said first impedance transforming means.

7. An oscillator in accordance with claim 6 further including stripline filter means for coupling a coarse tuning voltage to said voltage tunable series resonant circuit means.

8. An oscillator in accordance with claim 7 further including stripline filter means for coupling a fine tuning voltage to said fine tuning circuit to vary its impedance.

* * * * *